United States Patent [19]
Carey

[11] Patent Number: 5,165,166
[45] Date of Patent: Nov. 24, 1992

[54] METHOD OF MAKING A CUSTOMIZABLE CIRCUITRY

[75] Inventor: David H. Carey, Austin, Tex.

[73] Assignee: Microelectronics and Computer Technology Corporation, Austin, Tex.

[21] Appl. No.: 739,344

[22] Filed: Sep. 9, 1991

Related U.S. Application Data

[60] Division of Ser. No. 344,534, Apr. 25, 1989, Pat. No. 5,107,403, which is a continuation of Ser. No. 102,172, Sep. 29, 1987, abandoned.

[51] Int. Cl.$^5$ ............................................. H05K 3/02
[52] U.S. Cl. ...................................... 29/847; 29/850; 174/261
[58] Field of Search ................. 29/829, 830, 832, 834, 29/836, 840, 843, 846, 847, 850; 174/68.5

[56] References Cited

U.S. PATENT DOCUMENTS

| | | |
|---|---|---|
| 2,019,625 | 11/1935 | O'Brien . |
| 2,914,706 | 11/1959 | Hill et al. . |
| 3,028,573 | 4/1962 | Stoehr . |
| 3,128,332 | 4/1964 | Burkig et al. . |
| 3,142,112 | 7/1964 | Burkig et al. . |
| 3,148,438 | 9/1964 | Winter et al. . |
| 3,378,920 | 4/1968 | Cone ....................................... 29/847 |
| 3,478,425 | 11/1969 | Cooke . |
| 3,485,934 | 12/1969 | Prather . |
| 3,499,098 | 3/1970 | McGahey et al. . |
| 3,525,617 | 8/1970 | Bingham . |
| 3,535,780 | 10/1970 | Berger . |
| 3,564,115 | 2/1971 | Gribble et al. . |
| 3,621,116 | 11/1971 | Adams . |
| 3,683,105 | 9/1972 | Shamash et al. . |
| 3,702,025 | 11/1972 | Archer . |
| 3,711,627 | 1/1973 | Maringulov . |
| 3,718,936 | 2/1973 | Rice, Jr. . |
| 3,777,221 | 12/1973 | Tatsuko et al. . |
| 3,824,433 | 7/1974 | Newton, Jr. . |
| 3,838,317 | 9/1974 | Coyne . |
| 4,254,445 | 3/1981 | Ho . |
| 4,426,548 | 1/1984 | Oritsuki et al. . |

(List continued on next page.)

FOREIGN PATENT DOCUMENTS

| | | |
|---|---|---|
| 0016522 | 1/1980 | European Pat. Off. . |
| 0074303 | 3/1983 | European Pat. Off. . |
| 0167732 | 1/1986 | European Pat. Off. . |
| 0214628 | 9/1986 | European Pat. Off. . |
| 2929050 | 2/1980 | Fed. Rep. of Germany . |
| 2382101 | 9/1978 | France . |
| 2557755 | 5/1985 | France . |

OTHER PUBLICATIONS

IBM Technical Disclosure Bulletin vol. 13, No. 12, May 1971, p. 3653; E. G. Kutch: "Edge Definition as Related to Angled Electrode Lands".
IBM Technical Disclosure Bulletin vol. 14, No. 4, Sep. 1971, pp. 1316, 1317; E. C. Layden: "Use of Relatively Diagonal and Rectangular Wiring Planes in Multilayer Packages".
Flexmark Brochure—"How to Cut Your Flex Generation Lead Time from Weeks to Minutes!".

Primary Examiner—Timothy V. Eley
Attorney, Agent, or Firm—Arnold, White & Durkee

[57] ABSTRACT

A customizable circuit using a programmable interconnect and a compatible TAB chip bonding design. The programmable interconnect comprises layers of wire segments forming programmable junctions rather than continuous wires. This segmentation is performed with an offset from line to line in each layer such that the ends of the segments in each layer form along diagonal lines having a pitch determined by the basic wire segment length. The terminal ends of each of these segments are positioned in a plane such that the segments may be connected by short lengths to form the desired interconnect. The links which join the line segments represent the customization of the otherwise undedicated interconnect. The TAB chip bonding design uses a carrier tape to bond the integrated circuit chips to the programmable interconnect. Also disclosed are methods for forming the interconnect and the TAB chip bonding design.

19 Claims, 9 Drawing Sheets

U.S. PATENT DOCUMENTS

| | | |
|---|---|---|
| 4,434,321 | 2/1984 | Betts . |
| 4,438,560 | 3/1984 | Kisters . |
| 4,443,278 | 4/1984 | Zingher . |
| 4,458,297 | 7/1984 | Stopper et al. . |
| 4,467,400 | 8/1984 | Stopper . |
| 4,486,705 | 12/1984 | Stopper . |
| 4,489,364 | 12/1984 | Chance et al. . |
| 4,495,377 | 1/1985 | Johnson et al. . |
| 4,495,479 | 1/1985 | Hermann . |
| 4,521,262 | 6/1985 | Pellegrino . |
| 4,524,239 | 6/1985 | Rouge . |
| 4,636,919 | 1/1987 | Itakura et al. . |
| 4,652,974 | 3/1987 | Ryan . |
| 4,675,989 | 6/1987 | Galloway et al. ............... 29/847 |
| 4,720,915 | 1/1988 | Kennedy et al. ............... 29/847 |
| 4,744,007 | 5/1988 | Watari et al. . |
| 4,750,089 | 6/1988 | Derryberry et al. . |
| 4,764,644 | 8/1988 | Reisman et al. ............... 29/847 X |
| 4,791,238 | 12/1988 | Kanno et al. . |
| 4,907,127 | 3/1990 | Lee ............... 29/847 X |
| 5,023,751 | 6/1991 | Stampfli ............... 29/847 X |
| 5,060,116 | 10/1991 | Grobman ............... 29/847 X |

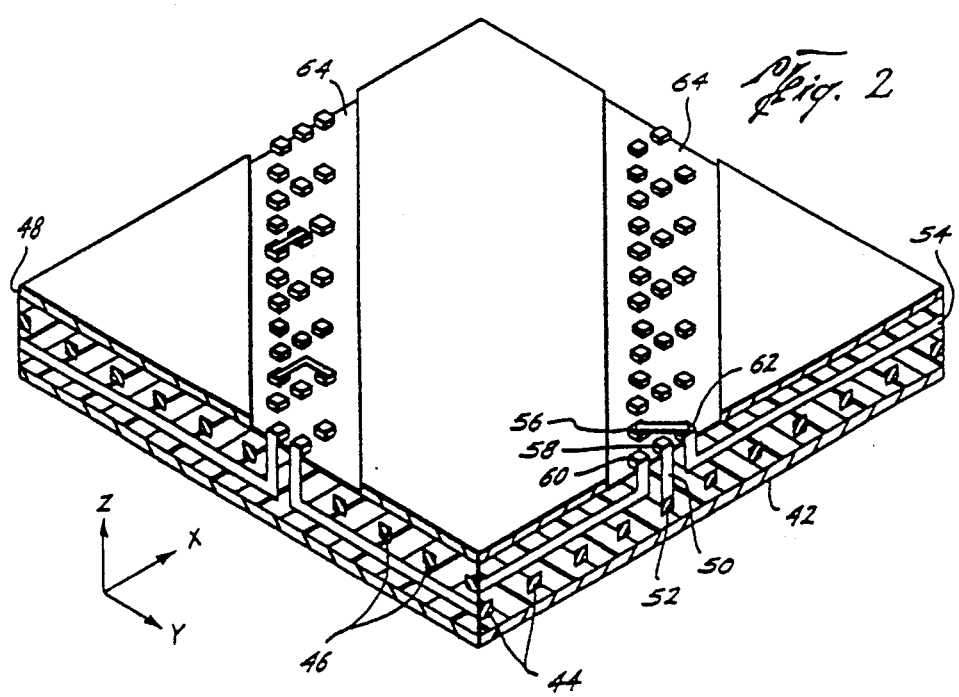
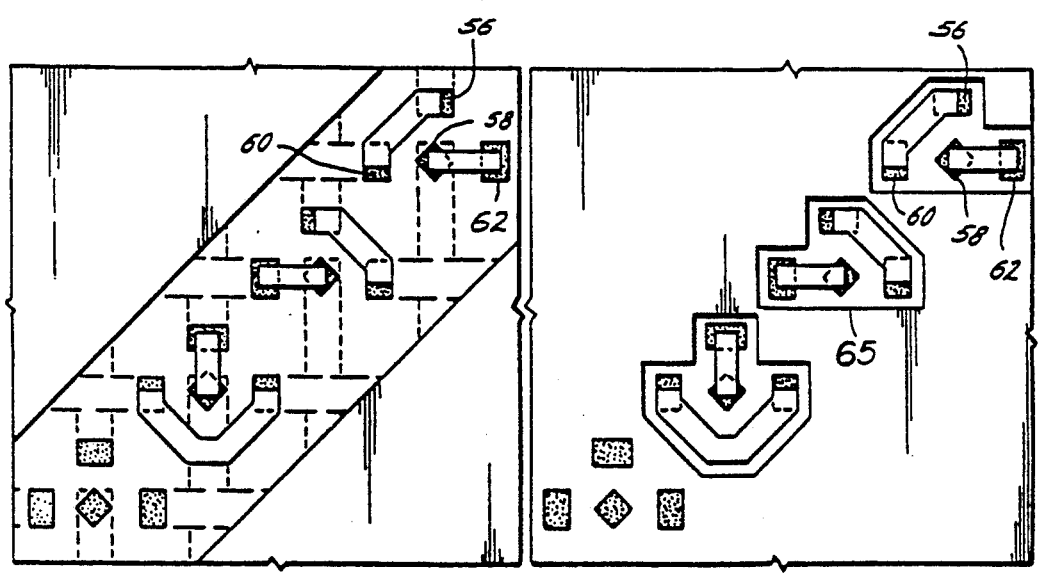

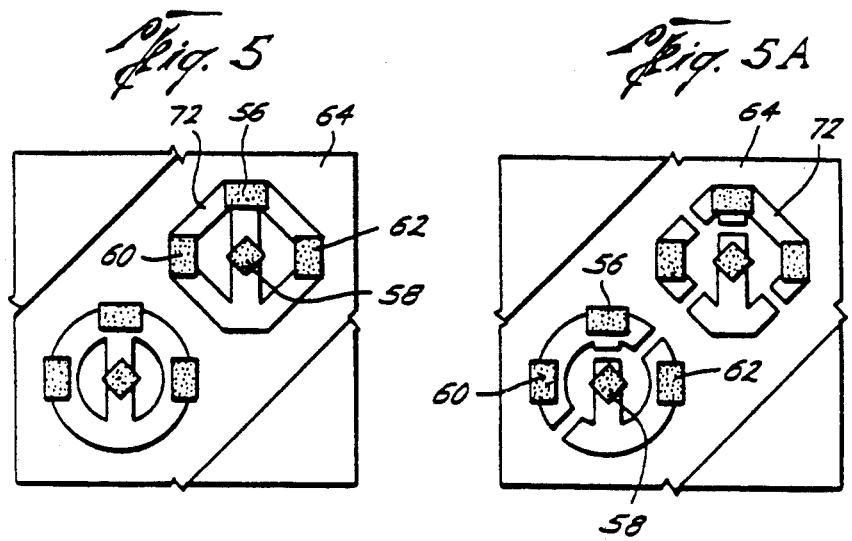
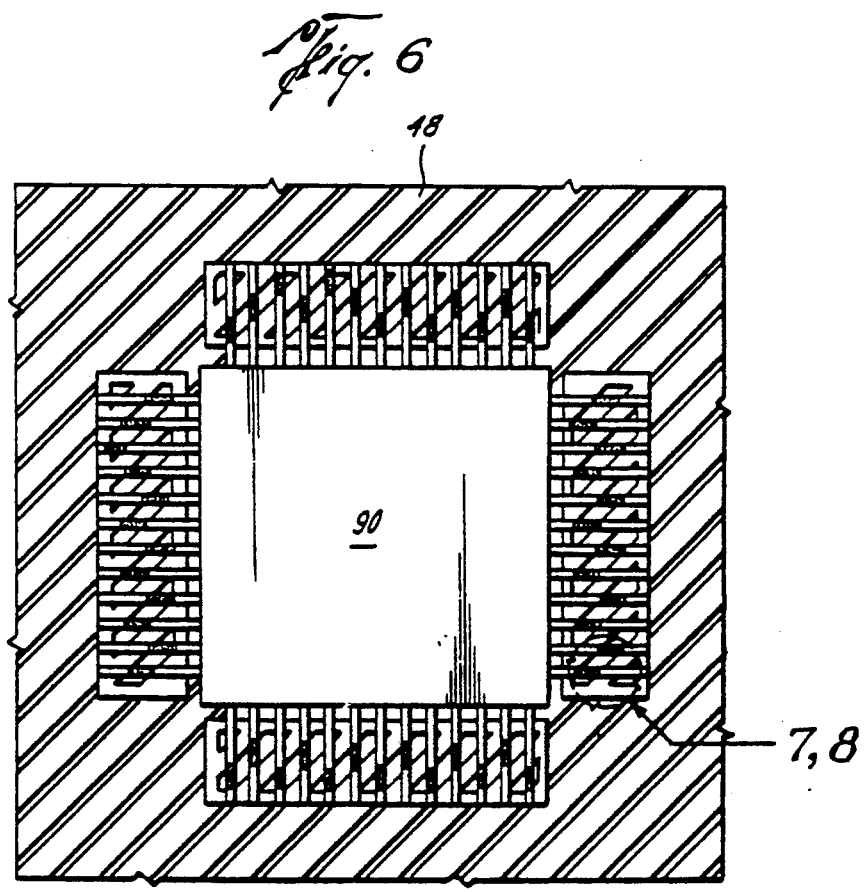

METHOD OF MAKING A CUSTOMIZABLE CIRCUITRY

This is a divisional application of application Ser. No. 07/344,534 filed Apr. 25, 1989, now U.S. Pat. No. 5,107,403, which in turn is a continuation of application Ser. No. 07/102,172, filed Sep. 29, 1987, now abandoned.

BACKGROUND OF THE INVENTION

The present invention relates to customizable circuitry, and particularly to customizable circuitry which includes an interconnect for receiving and electrically connecting electrical devices and tape automated bonding chip designs. The invention relates to an interconnect which can be produced in gross with an undedicated, universal structure and subsequently customized to a specific application with minimal effort and fabrication, and to a tape automated bonding chip design for use therewith. Further, the invention also concerns a method for manufacturing the interconnect and chip design.

Customizable circuitry, as used herein, refers to that circuitry in which some of the device interconnections are not made during the initial manufacture of the circuitry, but are deferred. This deferral allows the circuitry to be manufactured in large quantities with generic properties, with the specific design details being applied later by the user in a final step called "customization." Integral to customizable circuitry is a generic interconnect structure coupled with a method of bonding the leads of integrated circuit chips to that interconnect structure.

Interconnects, as building blocks for electronic circuitry and microcircuitry, typically receive and support further electrical devices, for example, substrates, i.e., smaller scale interconnects, integrated chips, capacitors, resistors and so forth, which can be electrically connected to one another to provide larger, more complex electrical structures. The interconnects typically have a sandwich-type structure through which a series of wires extend. The wires connect the electrical devices attached to the interconnect according to a plan specified by the interconnect user.

The interconnects are used in a multiplicity of designs, each requiring unique electrical circuitry. Presently, in a majority of the interconnects, the wiring plan is fixed at an early stage of manufacture In other words, the manufacturer lays down the interconnect wiring according to a specific, predetermined plan. Such interconnects will be referred to as "design specific. " As is readily apparent, design specific interconnects cannot be mass produced and are, therefore, time and cost intensive.

Recognizing the shortcomings of design-specific interconnects, there arose a need in the interconnect industry for an interconnect design which could be mass-produced in an unspecified manner and thereafter programmed to produce whatever wiring plan is required by the user. Such interconnects will be referred to as "programmable interconnects" and the final step of imposing the wiring plan on the interconnect will be referred to as "customization."

A previous attempt at programmable interconnect design is disclosed in U.S. Pat. No. 4,458,297 to Mosaic Systems, Inc. The Mosaic design provides interconnect wiring in the form of a grid with wires in one direction forming one plane and orthogonal wires forming a second plane. Positioned between the two sets of wires is a layer of amorphous silicon which, though originally non-conductive, can be rendered conductive at specified points of wire overlap The selective conductivity is achieved through crystallization of the amorphous silicon by applying a voltage differential across the orthogonal wires. The electric field produced by this voltage differential causes the silicon in the region of the overlapped wires to crystallize and become conductive. Therefore, an electrical path is formed between the overlapped wires The Mosaic structure is advantageous in that it provides for the mass production of undedicated interconnects which can be customized by the manufacturer or by the end user at a later stage of manufacture The Mosaic interconnect, however, has many drawbacks For example, because of the electrical properties required, a limited number of materials can be used. Amorphous silicon is the only suggested material for use as the intermediate layer Also, while a limited number of metals might be used for the interconnect wiring, aluminum is by far the best candidate because its properties are compatible with the amorphous silicon. The density of the Mosaic grid, and specifically the proximity of the wires in the overlap region, is limited since a sufficiently large area about the overlap region is required to avoid shorting of adjacent wires during crystallization. In other words, the electric field forms an area of flux between the overlapped wires extending into the area between adjacent overlap regions. If the wires are placed too close together, this region of flux may cause adjacent regions to bleed together and short the adjacent wires.

Another disadvantage of the Mosaic design is that it is only an additive process. In other words, the wire routing is formed by adding electrically conductive segments, i.e., the crystalline silicon bridges. The design is not subtractive. Accordingly, it is very difficult, if not impossible, to make changes to the customized interconnect. The difficulty in altering the customized wiring makes engineering changes impractical. A further and very crucial disadvantage in the Mosaic design results from the fact that each additive step, i.e., creation of the silicon bridge, excludes both affected orthogonal wires from further utilization in the interconnect plan, except as to this one route. In other words, if Xl and Y1 wires are bridged to provide an interconnect path, these wires, or segments thereof, cannot be used to provide another interconnect path, for to do so would result in a shorting of the two paths together This characteristic of the Mosaic interconnect severely limits the complexity of the interconnect for a given interconnect area. This complexity limit affects the interconnect efficiency for the available channels, called channel utilization. It is desirable to have high channel utilization since a given interconnect can be performed with fewer channels if high channel utilization is present In addition to Mosaic's electrical customization approach, mechanical customization has also been used in some areas. For example, "Wire-Wrap" involves the use of an interconnect having a number of metal pins extending orthogonally from the interconnect surface. After the wiring plan has been specified, the appropriate pins can be connected by wrapping wires about the appropriate pins. Because of the forces involved, large, rigid pins are needed along with large tools to wrap the wire securely. The process is time consuming, since only one wire is added at a time, and cannot be used for small scale circuits such as integrated circuits because of the large pins and tools required Another mechanical customization approach is the use of wire bonding to interconnect bonding pads provided on the surface of an integrated circuit The interconnect is provided by welding or sputtering a thin wire onto a metal bonding pad at each end of the desired interconnect path. This approach has many disadvantages, however, including very poor area efficiency. For example, the sputtering used requires the use of large bonding pads with large spaces between them to assure that the sputtering process does not destroy the pad or cause a short circuit. Further, because the interconnect wires are not insulated, the density is restricted to those interconnect Paths that do not require crossed wires. Thus, this procedure has most of the disadvantages of wire wrap with the additional disadvantage that interconnect paths cannot cross each other.

Turning now to the problem of mounting the integrated circuit chips, it is conventional practice to mount such chips on interconnect structures which serve to electrically connect the chips. The integrated circuit chips are frequently mounted on carrier film, or tape, by a process known as "Tape Automated Bonding" (TAB). To achieve efficiency in the resulting customizable circuit, it is important to match the chip bonding technique used to the particular interconnect structure.

Accordingly, there exists a need in the art for an improved customizable circuitry including a programmable interconnect which can be mass produced to include an unspecified wiring plan and which can be subsequently specified in the later stages of manufacture or by the end-user with a minimum of effort and time, and which can provide a dense interconnect structure which can be practiced at both the printed circuit and integrated circuit levels, and a tape automated bonding structure compatible with such interconnects.

SUMMARY OF THE INVENTION

It is, therefore, an object of the present invention to provide improved customizable circuitry.

Additionally, an object of the present invention is to provide an interconnect for customizable circuitry which can be produced as an undedicated interconnect and then customized based on user needs.

Another object of the present invention is to provide an interconnect structure which can be formed into interconnects of a variety of sizes.

Still another object of the present invention is to provide an interconnect which can be formed from a variety of materials.

Yet another object of the present invention is to Provide a low cost interconnect.

Still yet another object of the invention is to Provide an interconnect which can be customized in a simple manner with minimal fabrication.

A further object of the present invention is to provide an interconnect having a consistent wiring design which allows for ease in testing and manufacturing A still further object of the present invention is to provide an interconnect having predictable discontinuity effects and similar crossover loading for all lines.

Yet still another object of the invention is to provide a single interconnect which can accommodate a plurality of designs with only minor modification.

Additionally, it is an object of the invention to provide an interconnect which can serve at a variety of levels including packaging or other higher level interconnects.

Also, an object of the invention is to provide a process for forming an interconnect as defined above which involves the steps of forming an undedicated interconnect in which the underlying wire segments are accessible, and subsequently customizing the interconnect with a minimum of effort and fabrication.

A further object of the invention is a process, as defined immediately above, which, because of the consistent interconnect pattern, allows for a test and repair strategy at each step of the processing, thus providing for improved yields of finished products It is another object of the present invention to provide an improved tape automated bonding chip design for customizable circuitry.

It is a still further object of the present invention to provide an improved tape automated bonding chip design which is compatible with a programmable interconnect structure of the type described above Therefore, in accordance with one aspect of the present invention, there is provided a customizable circuit, comprising a programmable interconnect as described below, a carrier film bonded to the interconnect, and an integrated circuit chip bonded to the carrier film by a plurality of leads extending from the carrier film to the interconnect, wherein the bondsite areas of adjacent leads are staggered with respect to one another along a generally diagonally extending axis joining the center points of each of the bondsites.

The use of a programmable interconnect in conjunction with a tape automated bonding technique provides a customizable circuit having a wide scope of application. Since neither the interconnect nor the bonding techniques are restricted to a particular process technology, the resulting programmable circuitry can be manufactured in a wide variety of process technologies. Unlike customizable circuitry manufactured with an electrically programmable interconnect such as that made by Mosaic Systems, Inc., which requires the use of a particular silicon process, the present invention can be manufactured in all silicon processes as well as other material.

In accordance with another aspect of the present invention, there is provided an interconnect for connecting electrical components, comprising a first set of essentially parallel wire segments, a second set of essentially parallel wire segments non-planar and non-parallel to the first set of wire segments, a plurality of accessible programmable junctions formed from the terminal ends of intersecting wire segments, the plurality of programmable junctions forming a plurality of diagonally extending programming tracks, and means for selectively linking the wire segments at the programmable junctions. In a preferred embodiment the interconnect further comprises a customization layer above the first and second sets of wire segments, the customization layer comprises regions for accessing the programmable junctions. The access areas in the customization layer may be continuous across the layer or may be in the form of apertures therethrough.

The programming tracks can be positioned at a variety of levels in the interconnect. In one embodiment, the programming tracks are coplanar with the customization layer. In another embodiment, they are coplanar with the upper layer of the wire segments. In yet another embodiment, the tracks are coplanar with the lower layer of wire segments. In the latter two embodiments, the programming tracks are in the form of trenches extending to the wire planes.

Preferably, the first and second sets of wire segments are orthogonal, and the programming regions are parallel and extend at a 45 degree angle to the orthogonal wire segments.

The customization layer can receive a number of additional structures such as test pads, chip attaching means, etc. The layer can also support additional wiring, for example, design specific wiring in which connections are made between junctions, engineering changes, and defective line re-routing.

In accordance with yet another aspect of the present invention, there is provided a method for forming an interconnect for receiving and electrically connecting electrical components, comprising the steps of preparing a programmable interconnect for connecting electrical components, comprising a first set of essentially parallel wire segments, a second set of essentially parallel wire segments non-planar and non-parallel to the first set of wire segments, a plurality of accessible programmable junctions formed from the terminal ends of intersecting wire segments, the plurality of programmable junctions forming a plurality of diagonally extending Programming tracks, and customizing the programmable interconnect by selectively adding means for linking the wire segments at the programmable junctions.

In accordance with still another aspect of the present invention, there is provided a method for forming an inter connect for receiving and electrically connecting electrical components, comprising the steps of preparing a programmable interconnect for connecting electrical components, comprising a first set of essentially parallel wire segments, a second set of essentially parallel wire segments non-planar and non-parallel to the first set of wire segments, a plurality of accessible programmable junctions formed from the terminal ends of intersecting wire segments, the plurality of programmable junctions forming a plurality of diagonally extending programming tracks, and means for linking the wire segments at the programmable junctions, and customizing the programmable interconnect by removing the linking means between selective terminal ends of the wire segments The present invention results in a high performance programmable interconnect. The high cost typically associated with design specific interconnects is significantly lowered by the use of the present undedicated programmable interconnect Additionally, because a standard interconnect is produced each time, the volume and yield increase by avoiding the use of fully custom wiring, the turnaround time is drastically reduced since the customizer becomes responsible for only a small fraction of overall fabrication.

In comparison to the presently available programmable interconnects, the present design is capable of a much denser construction. Density here refers to the number of conductors (wires), and thus programmable junctions, which can be placed within a given interconnect area. As was previously noted, the electrically programmable interconnect of Mosaic and the mechanical wire-wrap and wire bond interconnects were limited in their densities by inherent material and/or processing requirements. The density of the present interconnect, on the other hand, is limited solely by the state of the art circuitry design since it utilizes the same construction specifications as the technology (e.g., integrated circuit, printed circuit, etc.) with which it is to be applied.

Additionally, the present interconnect, by arranging the programmable junctions, i.e., those points at which overlapping wires may be joined, along diagonally extending programming tracks maximizes the use of the interconnect surface as well as facilitating the use of common interconnect patterns such as bus routing, etc. The pitch, or the distance between the diagonally extending programmable regions, can be varied depending on the need for programmable junctions. This feature provides great flexibility to the interconnect design. The available remaining surface can be utilized for chip attachment, engineering changes, design specific wiring, etc.

Further, the present interconnect design can utilize any number of materials in comparison to the Mosaic design which is severely limited in its applicable materials.

Additionally, the consistent interconnect pattern allows for ease of testing, predictable discontinuity effects, similar cross-over loadings for all lines, and good plating characteristics. Regularity of the design allows "tiling" of good interconnect sections to achieve larger interconnects. The design also provides an inherent fault-tolerance by allowing route-around of non-functional wire segments. A test and repair strategy can also be employed at each step of the interconnect process, allowing potential yields of finished product to be quite high.

In accordance with an additional aspect of the present invention, there is provided a tape automated bonding chip design, comprising a carrier film, an integrated circuit chip positioned on the carrier film and a plurality of leads extending parallel from the chip and attached to the carrier film, the plurality of leads comprising an inner lead bonding portion and an outer lead bonding portion which includes a bondsite area, wherein the bondsite areas of adjacent leads are staggered, with respect to one another, along a generally diagonally extending axis joining the center points of each of the bondsites.

According to yet another aspect of the present invention, there is provided a method for bonding the outer leads of a tape automated bonding chip to an underlying interconnect having generally diagonally extending programming tracks, comprising the step of bonding an integrated circuit chip to an underlying interconnect at a plurality of bondsites of adjacent leads, the bondsites being staggered with respect to one another along a diagonal center line extending through the center points of the bondsites.

The TAB chip design provides a chip bonding design compatible with the programmable interconnect structure to produce customizable circuitry of higher density and greater flexibility than presently available techniques.

Further objects, features and advantages of the present invention will be apparent from a review of the detailed description of preferred embodiments which follows, when considered together with the drawings, a brief description of which follows.

BRIEF DESCRIPTION OF THE DRAWINGS

FIG. 2 is an isometric view of an interconnect according to the present invention.

FIG. 4 is an enlarged plan view of the diagonal interconnect region of FIG. 3 according to one embodiment of the present invention.

FIG. 4A as an enlarged plan view of the diagonal interconnect region of FIG. 3 according to another embodiment of the present invention.

FIG. 5 is an enlarged plan view of the diagonal interconnect region 3 according to one embodiment of the present invention.

FIG. 5A is an enlarged plan view of the diagonal interconnect region FIG. 5 after subsequent processing.

FIG. 6 is a plan view of an interconnect according to the present invention having a chip bonded thereto.

DETAILED DESCRIPTION OF PREFERRED EMBODIMENTS

Figure 1:
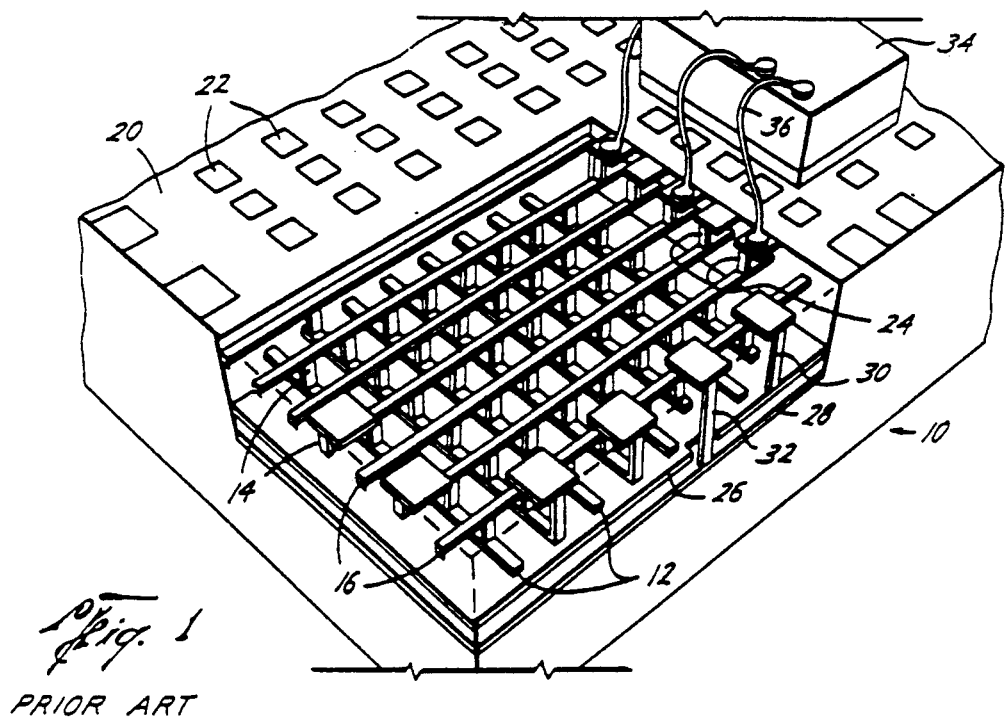
FIG. 1 isometric view of a presently available substrate.

FIG. 1 is an isometric, cut-away view illustrating one type of programmable interconnect design presently available, i.e., the Mosaic Systems, Inc. interconnect discussed Previously. The substrate 10 includes a set of aluminum wires 12 extending parallel to one another and joined by amorphous silicon programmable bridges 14 to a set of aluminum wires 16 extending orthogonally to the wires 12. The silicon bridges are originally non-conductive amorphous silicon, but through crystallization under an electric field are rendered conductive. The wires 16 form a plane separate from and above the plane formed by the wires 12. The programmable bridges 14 form available electrical pathways between the wires 12 and 16. The wires are covered by the layer 20. The layer 20 is provided with a number of pads 22 which are connected electrically to the wires 16 by further bridges 24. The pads 22 are selectively connected to underlying voltage planes 26, 28 by extended bridges 30, 32, respectively. The pads 22, in turn, are connected to chips 34 by wire bonds 36 extending from the chips to the pads.

During the original phase of manufacture, the above design is not specified, i.e., a particular wiring scheme is not fixed. Once an application is identified and a specific wiring scheme determined, the programmable bridges can be electrically changed to conductive bridges, thus producing the requisite customized wiring scheme. While this design overcomes the limitations inherent in the design specific interconnects which require complete customization, it too is limited. First, this prior art structure is limited in the materials which can be used. Specifically, amorphous silicon must be used in order to achieve the programmable bridge property necessary for subsequent programming. As has also been noted, the density of the Mosaic design is limited by processing characteristics. Additionally, once a wire has been used to form one wire route, no matter how short a segment is needed, the entire wire must be used and thereby rendered incapable of receiving further routing; otherwise, the two routes would short circuit.

The interconnect of the present invention has a sandwich structure. The actual number and types of layers depend on the particular application. FIG. 2 illustrates one type of interconnect structure according to the present invention. As illustrated, the interconnect 40 comprises an optional first plane 42. Plane 42 can be an electrically conductive plane, for example, a ground plane or a power plane. Additionally, both power and ground planes may be provided. The actual number and type of planes will depend upon user needs. For present purposes, the planes will simply be referred to as conductive planes. The conductive planes, besides their specific purposes, also help to control the impedance of the interconnect.

Extending above plane 42 is a plurality of wires 44 which are labeled as y-axis wires for the sake of convenience and later reference. The wires 44 extend essentially parallel to one another and are coplanar Though not shown, an insulation layer is typically positioned between the plane 42 and the wires 44, when plane 42 is present.

A second set of wires 46 is positioned above the wires 44 and extends essentially perpendicularly thereto. These wires have been marked as x-axis wires for the sake of convenience and later reference. The wires 46, like wires 44, extend essentially parallel to one another and are coplanar. The wires 44 and 46 form what will be referred to as y- and x-planes, respectively. An insulation layer, not shown in this view, is provided between the x- and y-planes. While the wires described here are orthogonally positioned, this is not required. Any relationship between the wires is possible, the only requirement being that the wires not be parallel so that the wires do overlap.

Finally, a customization plane 48 is positioned above the wires 46. The customization plane 48 generally provides a surface on which additional structures can be attached for carrying out other electrical processes. These structures include device attach pads, test pads, and facilities for engineering changes, defective line rerouting and overflow connections. The plane is formed so as to allow access to the terminal portions of the wires 44 and 46, as will be described in more detail immediately below.

As FIG. 2 illustrates, the x- and y-wires are formed into line segments by terminating the wires at certain select areas of wire overlap 50. For example, wire 52, extending in the Y-direction, terminates in the area of overlap 50 with wire 54, extending in the x-direction. The terminal portions 56, 58 of the y-wire 52 and the terminal portions 60, 62 of the x-wire 54 extend upward in the z-direction. Access areas are provided in the customization plane 48 to provide access to the ends 56, 58, 60, 62 of the wires.

The terminal ends 56, 58, 60 and 62 comprise what will be referred to hereinafter as a "programmable junction." The ends of the wires are linked to one another at the programmable junctions to establish the required wiring sequence in the interconnect, commonly referred to as routing. The access areas in the customization plane 48 allow the end user to access the terminal ends and interconnect same to achieve any routing scheme desired.

It has been discovered, in accordance with the present invention, that preferable and advantageous wiring results are achieved by forming the programmable junctions in a diagonally-extending pattern. As FIG. 2 illustrates, a diagonal track 64 has been formed through and across the customization plane 48 and the underlying diagonally-extending programmable junctions 66 are accessible therethrough. These diagonal tracts will be referred to as "programming tracks."

Figure 3:
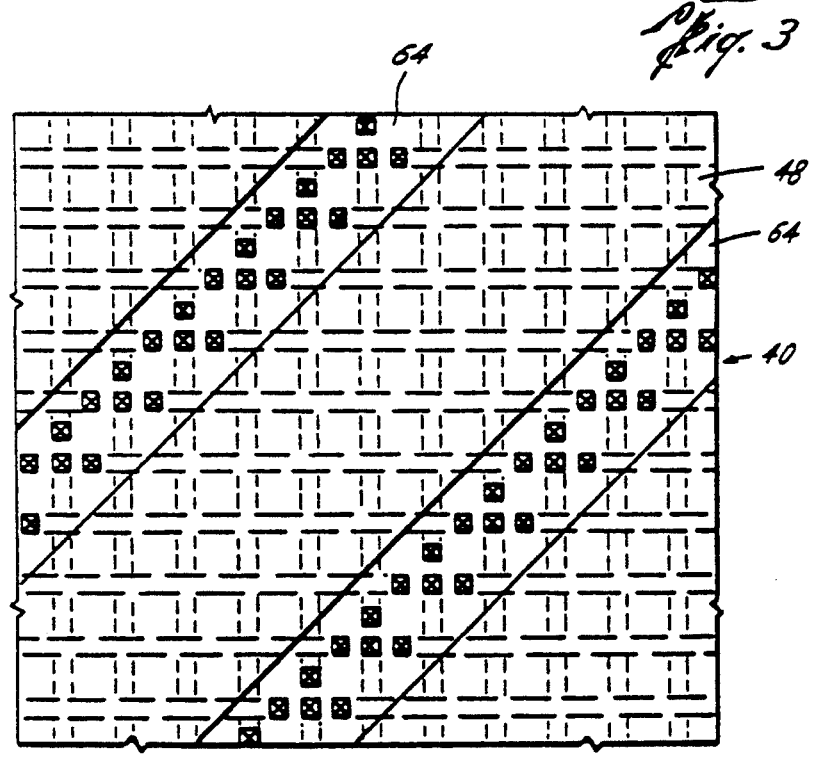
FIG. 3 is a plan view of the interconnect of FIG. 2.

FIG. 3 is a plan view of the upper customization plane 48 and interconnect 40 shown isometrically in FIG. 2. ~ The programming tracks 64 and programming junctions 66 can be seen in FIG. 2. The programming tracks can extend in the same direction (a single pattern) or can be perpendicularly positioned to extend diagonally across the interconnect in either direction (a "double" pattern). The double track Pattern, on the one hand, is advantageous since it provides a greater number of programmable junctions and therefore, greater flexibility for routing purposes. However, for most applications, the single track pattern will be sufficient. This is true for a variety of reasons. First, the single track pattern is simpler to design. Second, it is more compatible with integrated chips having tape automated bonding (TAB), a common means of chip bonding to be discussed below. Also, the single pattern typically offers more than enough programmable junctions for wiring purposes, both as to flexibility and directional changes, i.e., bus-type structures. Also, because the "single" track pattern utilizes fewer programmable junctions than the "double" track pattern, it is advantageous because excessive programmable junctions may detrimentally affect the electrical properties, as well as the yield, i.e., manufacturing defects.

Figure 18:
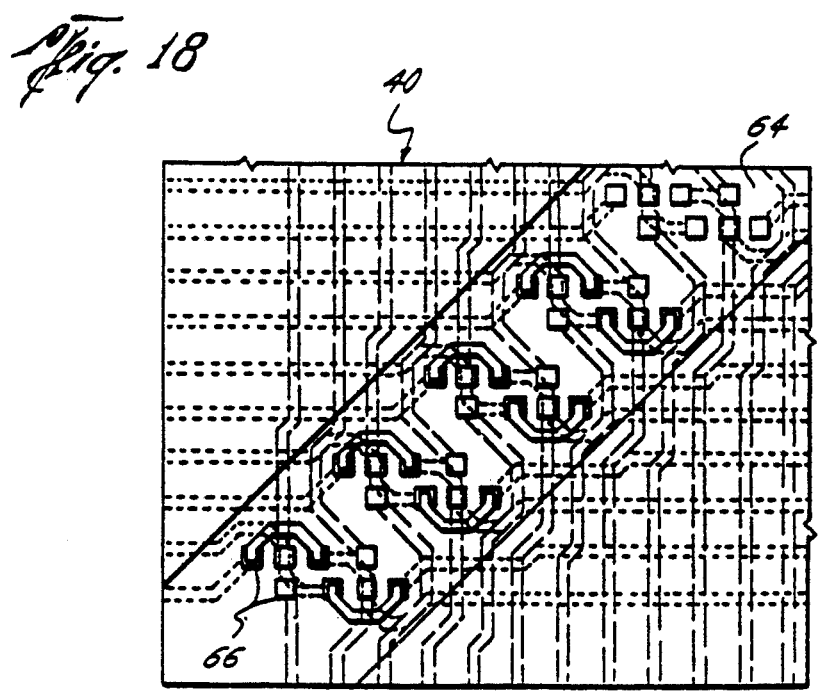
FIG. 18 is a plan view of the preferred embodiment of the programming tracks and programming junctions.

The programming tracks extend diagonally across the interconnect. Preferably, and especially with orthogonal wiring, the programming tracks extend diagonally across the interconnect at a 45 degree angle. However, the tracks can assume any angle depending solely on user needs. Also, the programming tracks do not have to be linear. The tracks can assume any geometry, again depending on user needs. Saw-tooth tracks, serpentine tracks and others are possible. The pitch (P), as a measure of the distance between successive programming tracks, is determined by the required flexibility of interconnect routing. The selection of the pitch is determined by the balance of the advantage of more locations at which directions may be changed and increased customization layer surface for attachment, testing, and additional wiring. The pitch (P) as a measure of the distance between successive x-wires or y-wires is as small as possible in order to increase the number of possible programmable junctions FIG. 18 illustrates a preferred embodiment of the programming tracks 64, and especially the programmable junctions 66 therein. As shown, the programmable junctions of adjacent wires are offset from one another along the programming track. This design allows higher line density in cases where the via diameter is greater than the line width, or in any similar situation where the programmable junction tends to limit the line-to-line spacing. This configuration also allows wiring to pass between the programmable junctions on the upper (customization) plane.

The diagonal programmable tracks are also advantageous because the length of connections between the wires is minimized. As FIG. 3 illustrates, the programmable junctions 66 Position the four wire ends from the x and y-wires in close proximity to one another.

Figure 2A:
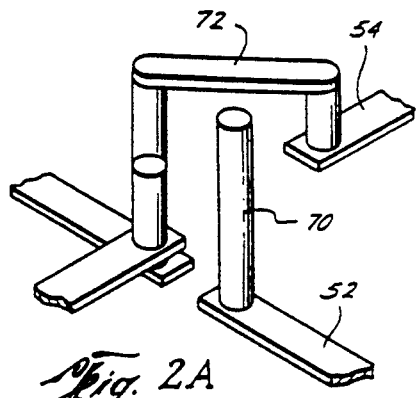
FIG. 2A is an enlarged sectional view of the pillar interconnect between the wiring structure of FIG. 2.

The connections between the wires are illustrated, for example, in FIG. 2A. FIG. 2A is an enlargement of an area of overlap, such as overlap 50 of FIG. 2. For reference purposes, the same reference numbers will be used. As shown, wire 52, extending in the y-direction, and wire 54, extending in the x-direction, terminate at overlap 50. The wires extend in different, but parallel, planes. Extending upward from the wires are electrically conductive pillars 70. These pillars 70 extend upward to a plane which forms the programmable junctions. As FIG. 2A shows, because wire 54 is in a plane above the wire 52, the length of the pillars from wire 54 to the interconnect plane is less than from wire 52 to the plane. The plan view of the pillars as shown in FIGS. 2A and 3 place the terminal ends thereof in essentially a T-shape. Advantageously, the pillars may extend along a diagonal orthogonal to the programming tracks. Such a layout facilitates routing access across programming tracks for wiring on the customization plane.

The final component in the interconnect region is the link 72 between the pillars 70. The link 72 extends from the upwardly facing ends of the pillars and provides an electrical connection between the pillars, and thus the underlying wire structure.

The process of specifying and then forming the interconnections between the wires represents the customization of what is an otherwise undedicated interconnect. Through customization, the various wire segments can connect in a variety of different manners as depicted by FIGS. 4, 4A, 5 and 5A. FIGS. 4 and 4A parallel one another in the type of connections made, but differ in the design of the customization Plane, a matter to be discussed in more detail below. For reference purposes, the ends of the pillars will be numbered in a fashion similar to FIG. 2, with the customization y-wire end (Y1) being end 56, the lowermost y-wire (Y2) being end 58, the leftmost x-wire (X1) being 60 and the rightmost x-axis wire end (X2) being 62. As the figures illustrate, the wire ends can be connected in a variety of different arrangements, for example, X1-X2, X1-Y1, X1-Y2, X2-Y2, or any combination thereof. The application of the links to the wires is known as "additive" customization This configuration also allows the use of the same programmable junction for two independent nets, often called "knock-knee" connections.

FIGS. 5 and 5A show another embodiment of the interconnect design, i.e., "subtractive" customization, in which a continuous connection shorting all four wire ends is provided The interconnect can undergo a subtractive process, e.g., laser etching, to disconnect select ends, thus defining the specific links. Subtractive customization also allows the simultaneous formation of programmable links, attachment pads, additional wiring, etc.

Figure 12:
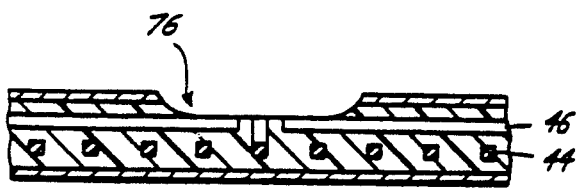
FIG. 12 is a cross-sectional view of another embodiment of the interconnect of the present invention.

The interconnect plane formed by the terminal wire ends can e positioned at a variety of heights measured in the z direction. As shown in FIG. 2, the interconnect plane can be parallel to the customization plane 48. In this embodiment the programming tracks 64 are formed in the customization plane and aligned with the diagonally-extending programmable junctions. In another embodiment, the interconnect plane is parallel to the plane formed by the upper set of wires. FIG. 12 illustrates this embodiment. In order to provide the necessary access to the interconnect region, a personalization "trench" 76 is formed in the upper layers of the interconnect 40. The base of the trench terminates in the plane formed by the upper set of wires 46. Such an arrangement offers advantages over the embodiment in which the programming tracks are coplanar with the upper customization plane. As a result of the design of FIG. 12, the pillars extending upward from wires 46, i.e., the top set of wires, are eliminated. In addition, the pillars extending from the lower set of wires 44 are reduced in length. The result is, in effect, a 66% reduction in the pillars necessary to bring the wire segment ends to the interconnect plane.

Figure 11:
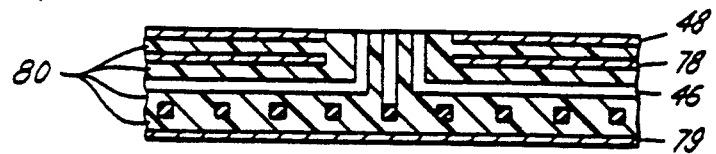
FIG. 11 is a cross-sectional view of one embodiment of the interconnect of the present invention.

The personalization trench can even be extended downwardly to the lower set of wires. This embodiment completely eliminates the need for pillars. In yet another embodiment of interconnect design, as illustrated in FIG. 11, a separate reference plane 78 is positioned between the upper set of wires 46 and the customization layer 48. The additional reference plane 78 provides for electric field isolation between the wires 44 and 46 and the structures on the customization plane 48, including programmable junctions, the chip attach pads, engineering changes, overflow wiring, etc.

In other embodiments, a first and second reference Plane are provided on either side of the wires, for example, in FIG. 11, planes 78 and 79 on either sides of wires 44 and 46.

FIG. 11 also reflects the provision of insulation 80 between the various interconnect layers. Typically, the interconnect sandwich, in cross-section, comprises metal separated by insulation. A variety of metals, for example, gold, copper, tungsten, are useful. A particularly preferred metal is copper. Also, the various layers can utilize different metals. Though not illustrated by the figures, it is also envisioned that, rather than an entire insulative layer, insulative strips may be used between the wire segments. Any electrically insulative material may be used. Preferred insulative materials include polyimide, ceramic, glass-epoxy laminates, and PTFE-glass boards. The polyimides are particularly preferred where the desired construction of the invention is for smaller interconnects.

Figure 13:
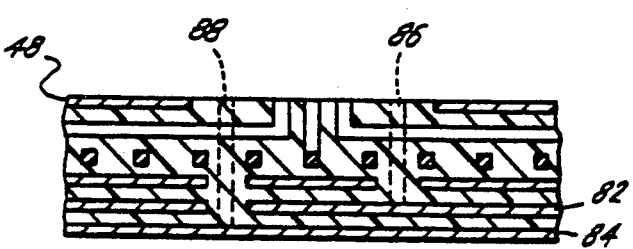
FIG. 13 is a cross-sectional view of yet another embodiment of the interconnect of the present invention.

FIG. 13 shows another embodiment of the interconnect according to the present invention. The interconnect includes multiple power planes 82 and 84. The exact number of power planes is determined by interconnect application. As illustrated, pillars 86, 88 extend upward through the interconnect to electrically connect the power planes 82 and 84, respectively, to the customization layer 48. Should these additional pillars overly complicate the interconnect structure, it is possible to address the power concerns by using the two reference planes, or an external structure onto which the interconnect may or may not be attached.

The determination of which of the various interconnect topologies to utilize will depend upon a comparison of the user needs and the tradeoffs in fabrication ease, customization ease, cost, performance, etc.

The areas for passage of the pillars to the interconnect plane and/or customization plane are commonly referred to as "vias". The present interconnect design is such that the vias do not block the various wiring channels since the wires terminate in the areas of x-y intersection and the vias are positioned in the termination areas. The design further allows for advantageous wiring compactabilty, for example, more than 500 lines per inch per layer are possible using 15 micron lines and 30 micron spaces. Higher line densities are possible with the only limitation being the lithographic capabilities.

Figure 1A:
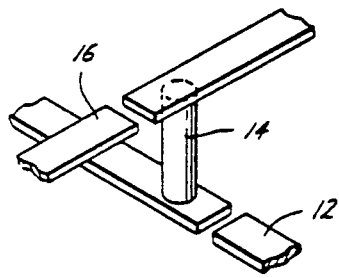
FIG. 1A an enlarged isometric sectional view of a blind via of the art non-universal substrates.

The present vias are accessible from the exterior of the interconnect and are designed such that the programmable junctions therein can be accessed to customize the routing. FIG. 1a illustrates the prior art via design, known as a "blind via". In the prior art, as each successive layer is applied, the lower layers become buried, making it impossible to access the interconnect structure externally. Since the vias used to interconnect lower layers are buried in the same process, they are inaccessible for further customization and are known as blind vias. While blind vias are not disadvantageous per se, they can create difficulty in situations requiring further changes or modifications as well as complicate the testing process. For these reasons, it is advantageous, where possible, to eliminate blind vias by providing access to all vias.

The use of wire segments in the interconnect allows for infinite pitch flexibility in the programming tracks. Also, since a series of wire segments are used rather than one continuous wire, use of a segment for one routing purpose does not disable use of the other wire segments in that wiring channel for other purposes. As was pointed out, disabling of entire wires is a drawback of the Mosaic electrically programmable design.

Figure 8A:
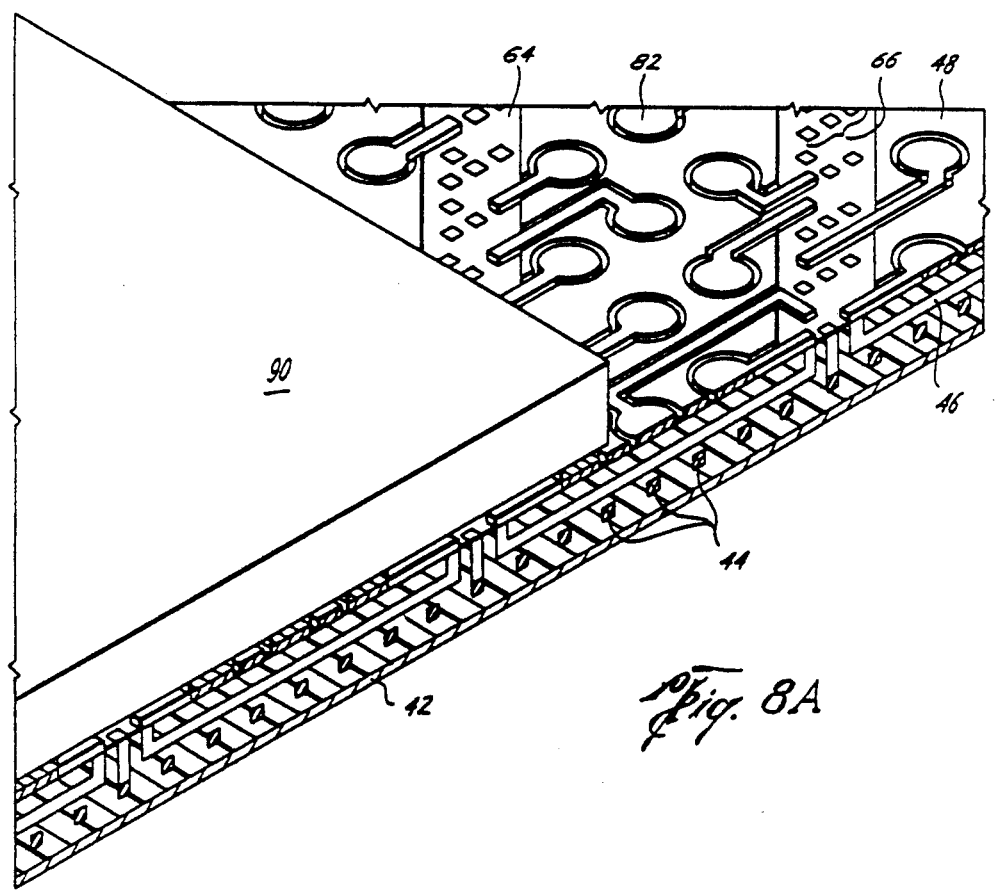
FIG. 8A is an enlarged isometric view of the area specified in FIG. 6 according to another embodiment of the present invention.
Figure 7:
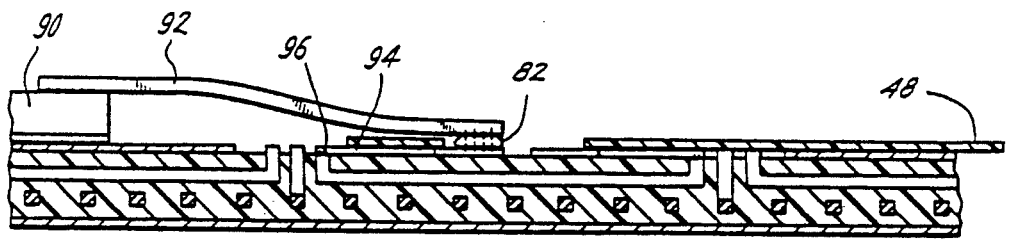
FIG. 7 is an enlarged cross-sectional view of the specified area of FIG. 6.
Figure 8:
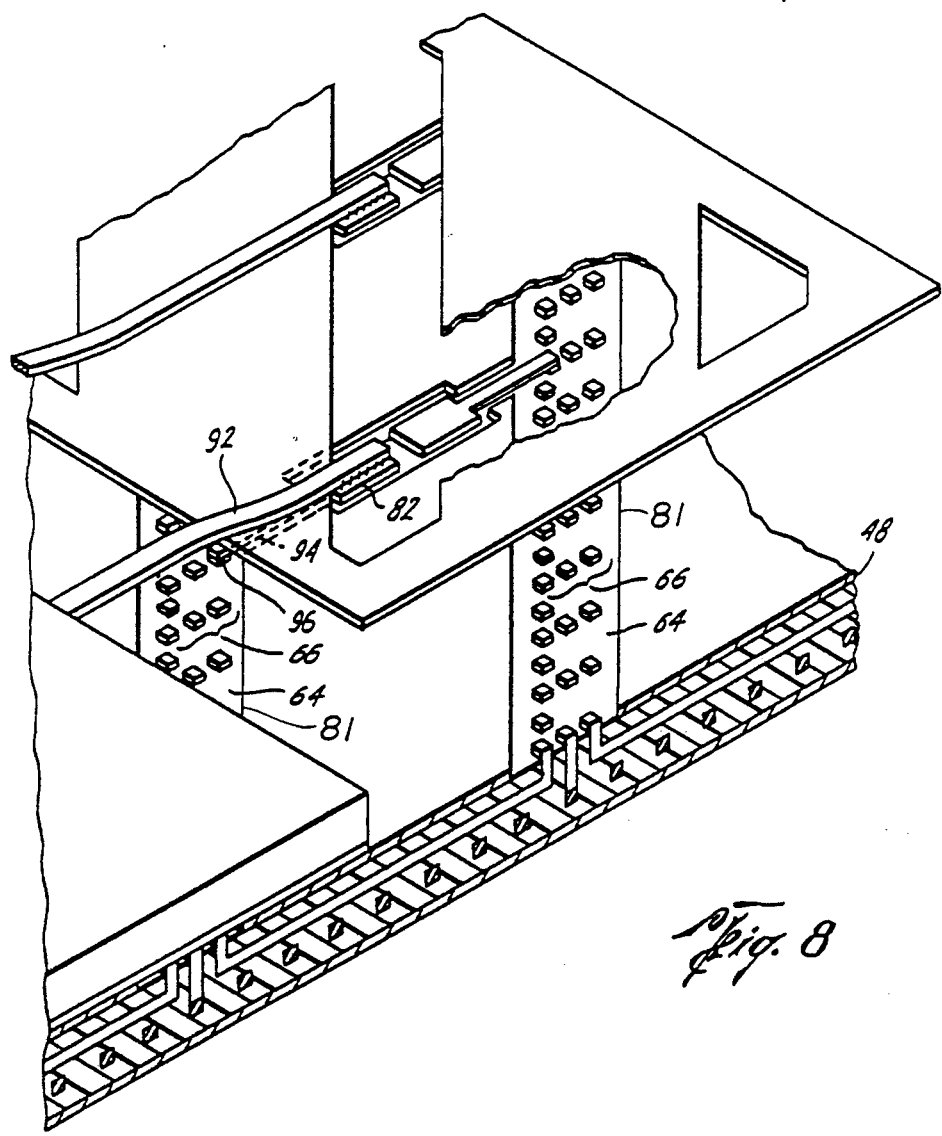
FIG. 8 is an enlarged isometric view of the area specified in FIG. 6 according to one embodiment of the present invention.
Figure 9:
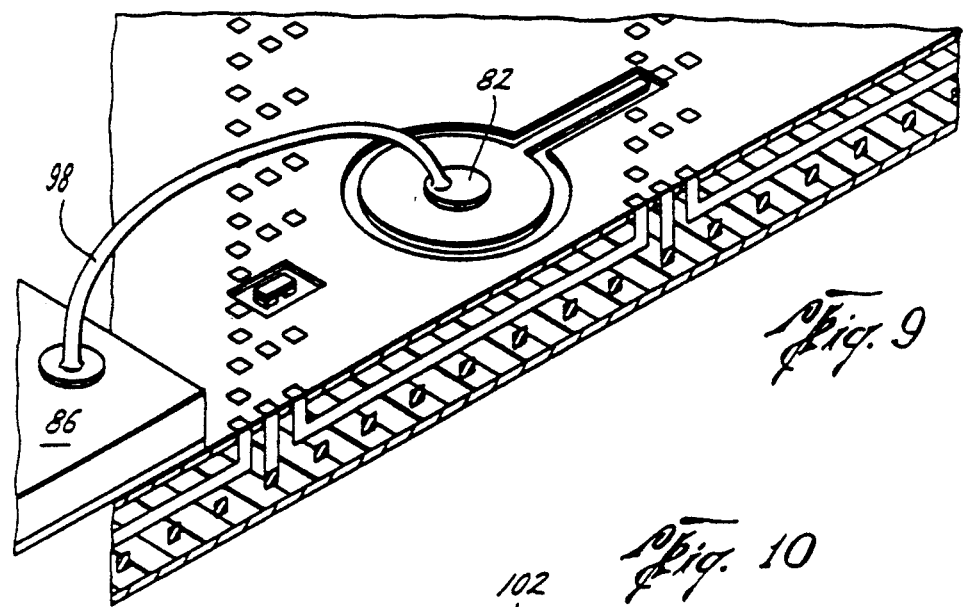
FIG. 9 is an enlarged isometric view of the area specified in FIG. 6 according to another embodiment.

The customization layer 48 of the interconnect is shown in more detail in FIGS. 7-9. A review of these figures reflects the variety of designs the layer can assume. FIG. 8, for example, shows a layer 48 having the continuous diagonal access tracks 81 which provide access to the programming tracks 64 previously described and illustrated in FIGS. 2 and 3. The tracks correspond to and overlay onto the underlying diagonally-extending programmable junctions 66. FIG. 4A illustrates a customization layer 48 having access regions in the form of cut-away portions 65 which provide access to the wire segment ends. Other modifications of the customization layer topography are possible, the primary objective simply being to allow access to the wire segment ends so that the necessary customization of the wiring routing can be achieved.

Besides providing for wire connections, the customization layer includes pads 82, see, for example, FIG. 7, for bonding to the leads from the integrated circuit chips. The Pads can be formed in the same plane as the wire interconnect region, and can be arbitrarily placed within the space separating the diagonal tracks or cutaways. As shown in FIG. 7, a chip 90 attaches to the customization layer 48. The chip includes leads 92 which extend from the chip and bond to the interconnect at the bonding pads 82. This process is referred to as outer lead bonding (OLB). The connection can, for example, be by means of a solder bump extending from the bond pad to the lead The pads 82, in turn, are electrically connected, as part of the customization of the interconnect, to select wire segment ends. As shown in FIG. 7, a connector 94 extends from the pad 82 to the wire end 96 FIG. 8 is an isometric representation of the interconnect of FIG. 7. The structures are similarly referenced.

FIG. 8A illustrates a further design of the customization layer 48 and OLB pads 82. The pads are circumferential, resembling islands in the customization layer, and the customization layer is contoured in a similar fashion. The customization layer includes the diagonal tracks. FIG. 9 shows a lead 98 extending from the chip 86 to the bonding pad 82.

The interconnect of the present invention, and particularly the customization layer thereof, is compatible with a variety of OLB techniques, for example, tape automated bonding (TAB), wire bonding, C4 bonding, etc. TAB-type bonding is particularly preferred and will be described in more detail below.

The selection of bonding pad sites is part of the interconnect customization. If only one outer lead bond is to be formed between diagonal access areas, the pads can be arranged in a straight line. If more than one bond is going to be present between programming tracks, the pads can be staggered The interconnect is compatible with either area or peripheral bonding.

As noted above, TAB-type bonding is a particularly preferred means for bonding the interconnect to integrated circuit chips. TAB-type bonding involves the mounting of the integrated circuit chips on a carrier film or tape. The tape, for example, may comprise a very thin polymide strip. The chip is affixed to the tape by means of the chip's outer signal and power leads. These leads are generally formed of copper and typically plated with tin, or noble metals such as gold, platinum, etc.

Typically, the leads extend from the centrally positioned chip in all directions. The leads generally have inner and outer lead bondsites. The inner lead bondsites (ILB's) connect the lead to the chip; the outer lead bondsites (OLB's) connect the leads to the interconnect. Because of the small scale at which the bonding must be performed, it is desirable to have center-to-center distances between adjacent OLB's sufficient to prevent overlap of the bonding connections between two bondsites which result in shorting the connection. This design objective, however, must be balanced against the need to use as little bonding area as possible in order to allow compact chip mounting In other words, if one were to spread out the OLB's over an interconnect to facilitate the bonding of the individual leads to the interconnect, it would result in the adjacent chip being positioned at greater distances from one another and thus fewer chips per unit area could be accommodated.

The present interconnect circuitry also includes the provision of a tape design for improved tape automated bonding for use with the present interconnect. The present tape design provides an improved means for bonding between the tracks and for maximizing the number of bondsites along a staggered row of sites. The tape design of the present invention also allows for more dense packing of chips onto an interconnect due to the shorter outer lead bonding length.

Figure 14:
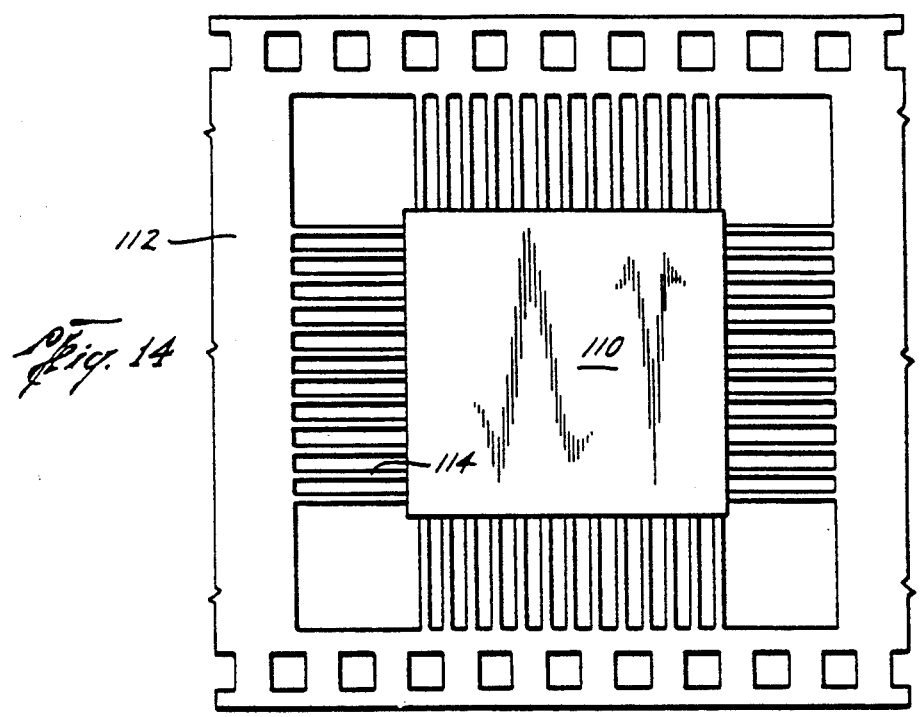
FIG. 14 is a schematic view of a carrier film having a chip attached thereto.

FIG. 14 schematically illustrates a typical "Tape Automated Bonding" (TAB) chip. As illustrated, a semiconductor integrated circuit chip 110 is affixed to a carrier film, or tape, 112 by means of outer leads 114. The tape is formed from an insulative material, for example, a polyimide. The polyimide tape is then covered on one side with a conductive metal, for example, copper The copper layer is then etched to form the desired lead pattern, with the non-etched copper areas forming the resultant leads. The polyimide tape is also etched or stamped to form an area for receiving the chip 110. This etch or stamp is generally performed in the center of the tape at the inner terminations of the leads. The non-etched leads are typically then plated with tin, gold or other noble metals. The chip is then placed onto the tape and ILB's (inner lead bonds) are formed between the chip and the inner terminal portions of the leads. The OLB's of FIG. 1 have a peripheral design. As FIG. 14 depicts, the leads fan-out from the ILB's to the OLB bondsites which are essentially aligned in a row Parallel to the chip edge. It should be noted that the lead design depends on the number of ILB's. In some designs in which a limited number of leads are present, the leads may not need to fan-out.

Figure 15A:
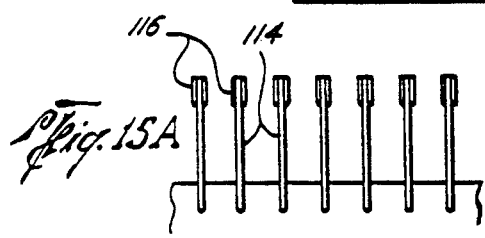
FIG. 15A is a schematic representation of OLB's positioned according to a peripheral bonding scheme.
Figure 15B:
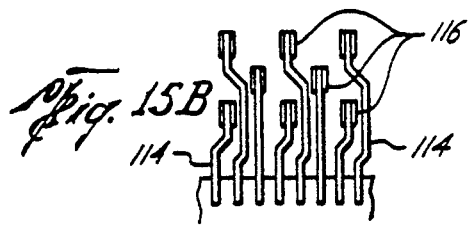
FIG. 15B is a schematic representation of OLB's positioned according to an area bonding scheme.

FIGS. 15A and 15B schematically represent peripheral and area bonding, respectively The outer leads 114 comprise bondsites 116. The peripheral bonding of FIG. 15A parallels that used in FIG. 14. FIG. 15B illustrates how the OLB's can be arranged in rows in a manner which spaces the center-to-center distances between bondsites to an optimal distance (r).

Figure 16:
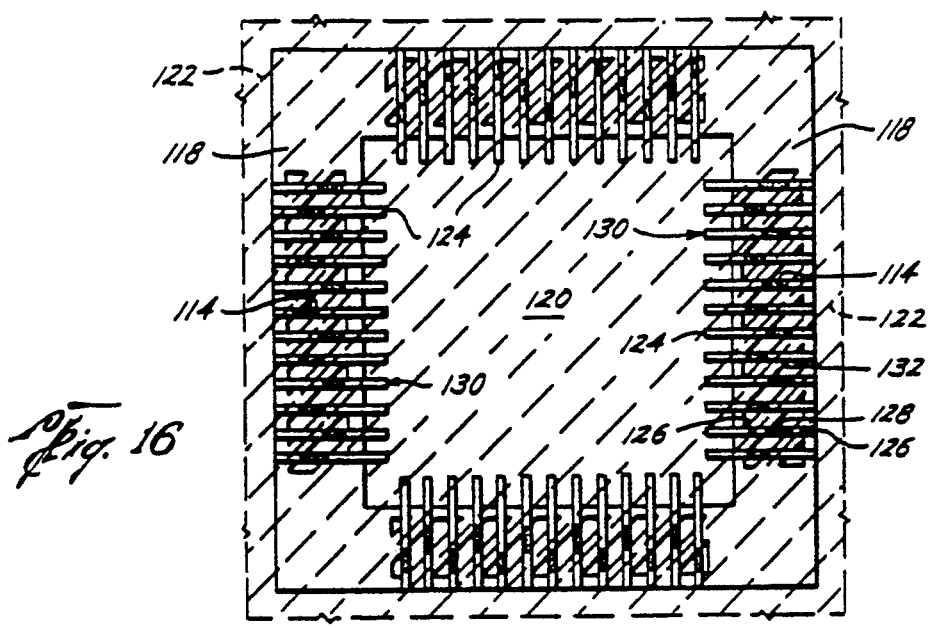
FIG. 16 is an enlarged plan view of a chip lead design.

FIG. 16 further illustrates the inner leads and the lead design according to the present invention. The leads 130 are shown extending from a TAB chip. The chip itself is not shown, but would be positioned, as previously described, in the center of the structure. Starting from the center and working outwardly along the leads, a lightened lead area 124 is shown along the inner edge of the rectangular rim 118. This portion of the leads is the inner lead bonding area which attaches to the chip. The rectangular rim 118, in fact, represents the polyimide tape. As previously described, the polyimide tape is removed in the area where the chip is to be located Typically, the area where the tape is removed is larger in size than the chip itself leaving a gap between the chip and tape across which the inner leads 124 extend. The cross-hatched area 120 represents the underlying interconnect. The diagonal lines 122 schematically represent the diagonally-extending programming tracks or interconnect regions at which the signal scheme is selected.

Continuing outwardly from the inner leads 124 and onto the tape section 118, the leads are depicted by alternating dark sections 126 bounding a lighter shaded area 128. As shown, the areas 128 of successive leads are staggered along a center-line axis which parallels the diagonal programming tracks 122 and places the areas 128 between the programming tracks. The areas 128 represent the OLB's for bonding the leads to the underlying substrates. As designed, the bondsites do not overlap or interfere with the programming tracks 122.

In order to form the bond between the leads 130 and interconnect 120, it is necessary to form a staggered window between the leads and interconnect at the staggered bonding areas 128. A preferred approach is to form the window in the polyimide tape by removing the tape from the underneath side of the leads along the staggered bondsites 128 of FIG. 16. For example, parallelogram-shaped "boxes" 132 could be formed as shown. Alternatively, the tape could be removed only in the area of the bonds 128. Another option is to form a solder mask over the interconnect 120 in which the mask is designed to correspond to the bondsites 128.

Figure 17:
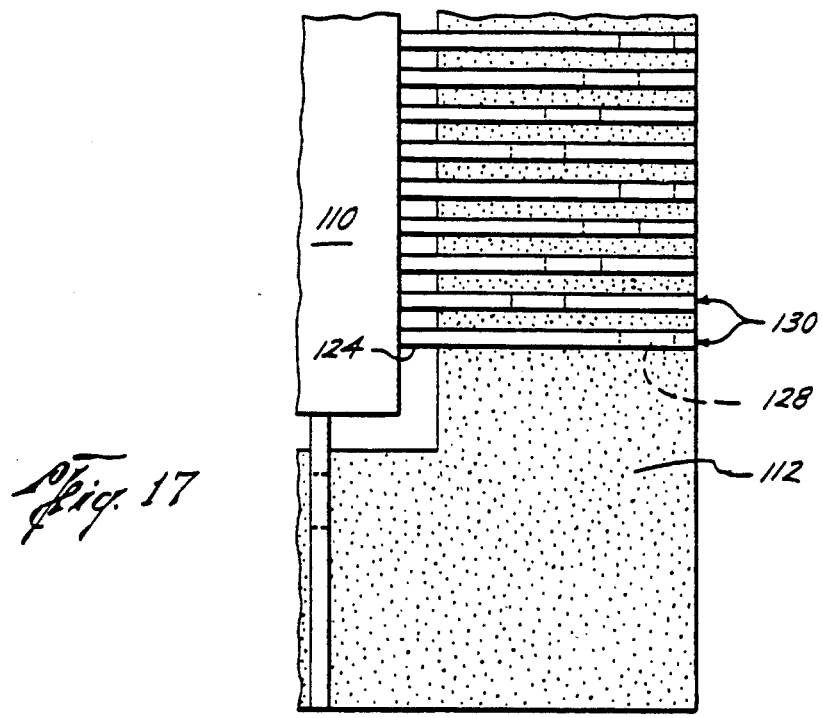
FIG. 17 is an enlarged sectional plan view of a chip lead design.

FIG. 17 is an enlarged representation of a section of leads 130 of the lead design of FIG. 16. The leads, as previously discussed, comprise inner lead bond sections 124 which form ILB's with the chip 110, and OLB's 128 which are staggered in adjacent leads. The outer lead bondsites 128 have not been cross-hatched though they are sections along a continuous lead. The absence of cross-hatching allows for further representing that the tape 112 has been removed at each bondsite 128. FIG. 17 also illustrates that the staggered positioning of the bondsites 128 increases the center-to-center distance of adjacent bondsites. The increased distance allows for improved operation. For example, because the bondsites are farther apart, there is less opportunity for a solder bump of one outer lead bondsite to bleed over to the adjacent site and short circuit the leads. Also, the present staggered OLB design decreases chip footprint size, while still maximizing center-to-center distance to the extent possible. The design also positions a number of outer lead bondsites between adjacent programming tracks of the underlying interconnects.

Figure 10:
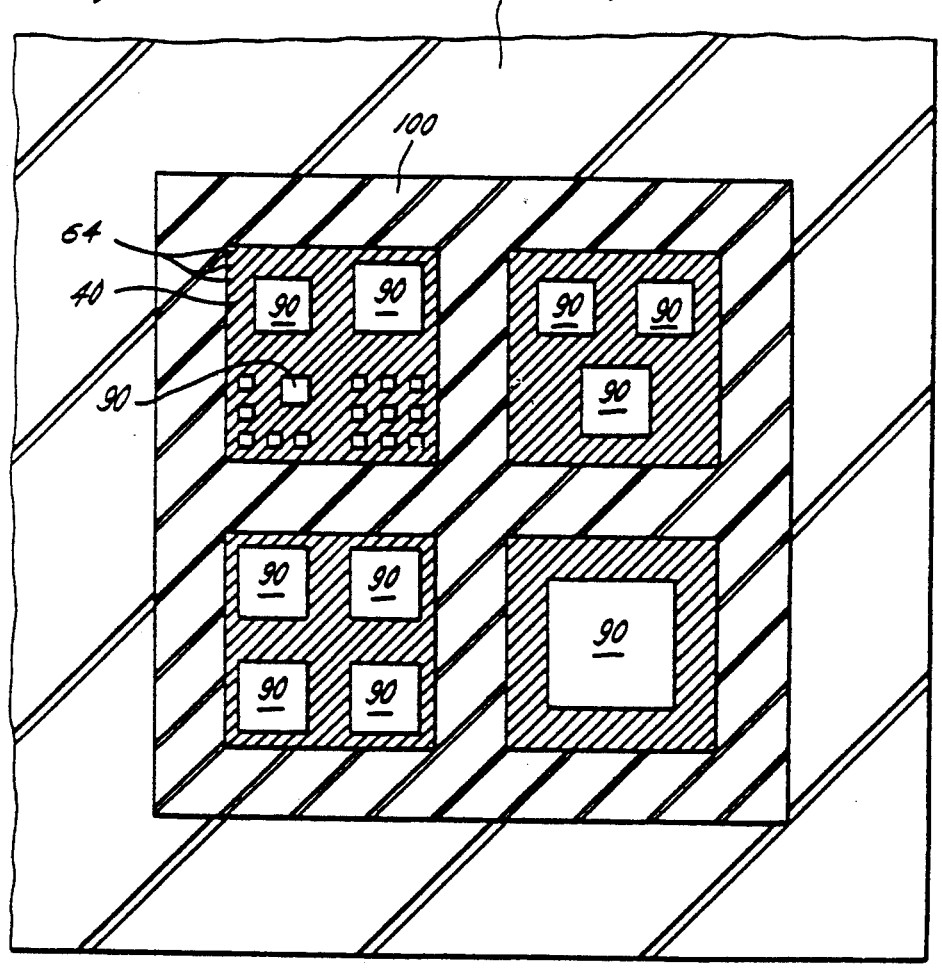
FIG. 10 is a plan view of multiply overlaid and interconnected interconnects according to the present invention and having chips attached thereto.

FIG. 10 illustrates the interconnect 40 with the diagonally-extending programming tracks 64 and a plurality of different-sized chips 90 attached thereto. The figure also illustrates that interconnects having differing pitches of diagonal programming tracks can be interconnected. For example, top interconnect 40 is attached to middle interconnect 100 which in turn is attached to lower interconnect 102. This figure is used to show the applicability of the invention to numerous levels or layers of an overall package scheme.

FIG. 6 is a plan view of the chip 90 bonded to the interconnect 48 through the access areas 64. The Figure illustrates the use of square Kapton supports which are employed with staggered OLB pads which align to diagonal spaces between he diagonal access areas.

Additionally, though not shown by the figures, the customization layer can also support overflow wiring, engineering changes (EC), test pads and defective line rerouting. Also, to improve electrical performance of the multiple vias present in the interconnect, ground vias can be added in the spare space of the customization layer The vias serve to lower inductance, realign characteristic impedance and reduce coupling Also, the vias from the ground and power planes extend to the customization plane, preferably in the areas of the bonding pads. The customization layer between the programming tracks 65 serves as a high frequency shield to reduce coupling and impedance imbalance between x- and y-layers.

It is also envisioned that the customization plane can support wiring connecting programmable junctions. In other words, the present interconnect provides for a limited amount of design-specific wiring on the customization layer For example, referring to FIG. 2, a wire could extend on the customization plane from a programmable junction at one point along the programming track to a programmable junction at another point along the programming track.

The final step in the interconnect production is the customization of the undedicated interconnect. Customization embodies chip connections and the links between the underlying wiring. More specifically, customization refers to the process by which the standard interconnect is customized for a specific end use. The wiring schemes to be established include (1) the underlying wire circuitry, (2) the bonding pads to the select wiring ends, (3) the ground or power vias and (4) any test pads or overflow wiring. The customization can be achieved through a single processing step, thus avoiding multiple patterning steps which are expensive The single processing step can include single Pattern lithographic techniques and user-assisted techniques, for example, either direct or indirect write. The process can be subtractive or additive. In other words, the links can be selectively applied to achieve the desired interconnect pattern, i.e., additive, or lines can be applied universally throughout the interconnect and then removed, for example, by laser-etching, to achieve the desired end product, i.e., subtractive.

The customization can be done quickly, for example, on the order of a few hours or less. This is a marked improvement over the presently available interconnects, some of which require days or months to develop. The customization can be performed by the end user, with the undedicated interconnect structure being mass produced.

The interconnect of the present invention can be produced by a variety of methods. The manufacturing method described below is used to form an interconnect having a reference layer below the lower layer of conducting wires, two layers of conducting wires and a top customization layer. As will become apparent from the discussion below, the various steps can be excluded or repeated to produce the specific interconnect designs previously discussed. In accordance with the present method, a supporting interconnect, such as ceramic or other material, is selected to receive the conducting layers of the interconnect. The support may be rigid or flexible. A conductive material is then deposited on the interconnect to form a lower reference plane for the conductive wires. The conductive material can be deposited by sputtering, electroless plating, electroplating or lamination. Optionally, a dielectric layer may be formed between the supporting interconnect and the lower reference plane. An additional dielectric layer is placed on top of the lower reference layer to separate this layer from the interconnect layers which follow.

The lower layer of conductive wires is formed by etching of a blanket layer of metal which is applied in the same manner as the lower reference layer Alternatively, a lift-off technique or plating method may be used to form the conductors. Vias are required to connect the lower layer of conductive wires or the underlying reference or voltage planes to the top surface where customization occurs. A stacked via approach is preferred such that the area of via cluster is minimized, and thus line density is maximized. Formation of the stacked via may be achieved through anisotropic etch, or for filled vias by electroless plating or electroplating. For the latter method, a plating interconnect is necessary at the layer preceding the via level.

A further dielectric layer is used to separate the lower conductive layer from the upper conductive layer. This dielectric may be spun on top of the existing layers in liquid form and cured to a hardened state. If electroplating is used to form the stacked via, this dielectric must flow around the plated-up via structure. In order to create a planar surface for additional layers, it is convenient to planarize the cured dielectric layer through which the vias protrude. This can be accomplished by several well-known planarization techniques, including etchback and mechanical polishing.

The second layer of conductive wires is formed in a manner identical to that for forming the first layer of conductive wires, with the appropriate vias from the underlying layers connecting to the second conductor layer. The Preceding steps for forming the vias, dielectric and planarization are repeated to continue the migration of the upper and lower (X and Y) wire segments ends up to the topmost surface where customization occurs. A top reference layer is formed according to the same process as used for forming the other reference planes. This top reference plane may be a final layer, or alternatively, the above steps may be appropriately repeated to bring the wire segment ends to a layer above the top reference plane.

As can be understood from the above discussion, these various techniques can be repeated or modified to produce a variety of specific interconnect structures, depending on user needs.

As a result of the present design, the resulting interconnect is scalable to whatever technology with which it is to be used. Less dense interconnects are used in printed circuit applications and more dense interconnects are used in integrated circuit applications. This results from the fact that the construction of the interconnect utilizes the construction of the technology. Only the design remains constant. Thus, as circuitry construction becomes more sophisticated, the interconnect construction will keep pace.

In addition to the advantages of the present structure discussed above, the consistent interconnect pattern of the present invention provides for ease in testing the wiring and makes for predictable discontinuity effects. The interconnect also allows for similar crossover loading for all lines, as well as for good plating characteristics Also, the lines provide for high-speed signal transport with controlled impedance. The ground vias can be mixed with personality vias to reduce via discontinuity.

The design also provides inherent fault-tolerance by allowing route-around of non-functional line segments. A test and repair strategy can be employed at each step of the interconnect processing, allowing potential yields of finished product to be quite high.

The regularity of the interconnect design may also allow "tiling" of good interconnect sections to achieve larger interconnects. The interconnect can be used as a first level packaging or can be extended to generic interconnect vehicles at higher levels of packaging, e.g., as an interconnect for modules and printed circuit boards.

The primary application of the present interconnects is to provide high performance multi-chip customizable circuitry. The high cost typically associated with such interconnects is lowered dramatically by the present universal interconnect. By avoiding the use of fully custom wiring, volume and yield are increased and the end user is thus responsible for only a small fraction of the overall fabrication. By taking advantage of a compatible chip bonding design, density and flexibility of the resulting customizable circuitry is greatly enhanced.

The present invention, therefore, is well adapted to carry out the objects and obtain the ends and advantages mentioned, as well as others inherent therein. While presently preferred embodiments of the invention have been described for the purpose of disclosure, numerous changes in the details of construction and arrangement of parts may be made without departing from the spirit of the present invention and the scope of the appended claims.

What is claimed is:

1. A method for forming an interconnect for receiving and electrically connecting electrical components, comprising the steps of:
    preparing a programmable interconnect for connecting electrical components, comprising a first set of essentially parallel wire segments, a second set of essentially parallel wire segments non-planar and non-parallel to said first set of wire segments, a plurality of accessible programmable junctions formed from terminal ends of intersecting wire segments, said plurality of programmable junctions forming a plurality of diagonally extending programming tracks; and
    customizing said programmable interconnect by selectively linking said wire segments at said programmable junctions.

2. A method for forming an interconnect for receiving and electrically connecting electrical components, comprising the steps of:
    preparing a programmable interconnect for connecting electrical components, comprising a first set of essentially parallel wire segments, a second set of essentially parallel wire segments non planar and non-parallel to said first set of wire segments, a plurality of accessible programmable junctions formed from terminal ends of intersecting wire segments, said plurality of programmable junctions forming a plurality of diagonally extending programming tracks, and means for linking said wire segments at said programmable junctions; and
    customizing said programmable interconnect by selectively removing said linking means between selected terminal ends of said wire segments.

3. A method forming a multi-layer programmable electrical interconnect comprising:
    forming a X-conductor layer having a plurality of substantially of electrically conductive segments of substantially uniform length arranged end-to-end;
    forming a Y-conductor layer having a plurality of substantially parallel channels, each channel including a plurality of electrically conductive segments of substantially uniform length arranged end-to-end, the X-conductor layer and Y-conductor layer being formed whereby the channels of the X- and Y- layers overlap;
    forming a customization surface over said x- and Y-layers; extending a majority of the segment ends in the X- and Y-layers to the customization surface; and
    forming a plurality of programmable junctions on the customization surface in a regular pattern, each programmable junction comprising segments ends of two adjacent X-conductor layer segments in the same X-conductor layer channel, and segment ends of two adjacent Y-conductor layer segments in the same Y-conductor layer channel, the programmable junctions being formed whereby selective electrical linkage can be accomplished on the customization surface between all combinations of the segment ends forming the programmable junction, thereby permitting selective X to X, Y to Y, and X to Y linkage between the segment ends forming each programmable junction, as well as combinations of X to X, Y to Y, and X to Y linkage.

4. The method of claim 3 wherein said step of forming said plurality of programmable junctions further comprises forming said programmable junctions in a plurality of diagonally extending programming tracks on said customization surface.

5. The method of claim 4, wherein said programming tracks are formed to extend substantially parallel to one another, and at a substantially 45° angle to the Y-conductor layer channels.

6. The method of claim 3, wherein the X-conductor channels and Y-conductor channels are formed substantially orthogonal to one another.

7. The method of claim 3, further comprising forming electrical insulation between the Y-conductor layer segments and X-conductor layer segments at least in areas where such segments overlap.

8. The method of claim 7, the X-conductor layer and Y-conductor layers being formed to lie in substantially parallel planes.

9. The method of claim 8, the Y-conductor layer and customization surface being formed to lie in substantially parallel planes.

10. A method of forming and programming a multi-layer programmable electrical interconnect comprising:
    forming a X-conductor layer having a plurality of substantially parallel channels, each channel including a plurality of electrically conductive segments of substantially uniform length arranged end-to-end;
    forming a Y-conductor layer having a plurality of substantially parallel channels, each channel including a plurality of electrically conductive segments of substantially uniform length arranged end-to-end, the X-conductor layer and Y-conductor layer being formed whereby the channels of the X- and Y- layers overlap;
    forming a customization surface over said X- and Y- layers;
    extending a majority of the segment ends in the X- and Y-layers to said customization surface;
    forming a plurality of programmable junctions on the customization surface in a regular pattern, each programmable junction comprising segment ends of two adjacent X-conductor layer segment in the same X-conductor layer channel, and segment ends of two adjacent Y-conductor layer segments in the same Y-conductor layer channel; and
    programming the interconnect by selectively forming electrical linkages on the customization surface between the segment ends forming the programmable junctions, to form X to X, Y to Y, and X to Y linkage between the segment ends forming the programmable junctions, as well as combinations of X to X, Y to Y, and X to Y linkage.

11. The method of claim 10 wherein the step of forming said plurality of programmable junctions further comprises forming said programmable junctions in a plurality of diagonally extending programming tracks on said customization surface.

12. The method of claim 11, wherein said programming tracks are formed to extend substantially parallel to one another, and at a substantially 45° angle to the Y-conductor layer channels.

13. The method of claim 11, said programming step comprising forming substantially all of the electrical linkages on the customization surface between segment ends with a single pattern on the customization surface.

14. The method of claim 11, wherein the X-conductor channels and Y-conductor channels are formed substantially orthogonal to one another.

15. The method of claim 10, further comprising forming electrical insulation between the Y-conductor layer segments and X-conductor layer segments at least in areas where such segments overlap.

16. The method of claim 5, the X-conductor layer and Y-conductor layer being formed to lie in substantially parallel planes.

17. The method of claim 10, the Y-conductor layer and customization surface being formed to lie in substantially parallel planes.

18. The method of claim 10, said programming step comprising forming substantially all the electrical linkages on the customization surface between segment ends without crossing over other electrical linkages on the customization surface.

19. A method for forming an interconnect for receiving and electrically connecting electrical components, comprising:
    providing a programmable interconnect for connecting electrical components, including a X-conductor layer and a Y-conductor layer, each having a plurality of substantially parallel channels, each channel including a plurality of electrically conductive segments of substantially uniform length arranged end-to-end, segment ends of the X- and Y- layers extending to a customization surface of said interconnect to form a plurality of programmable junctions on the customization surface in a regular pattern, each programmable junction comprising segment ends of two adjacent X-conductor layer segments in the same X-conductor layer channel, and segment ends of two adjacent Y-conductor layer segments in the same Y-conductor layer channel; and
    customizing said interconnect by forming electrical linkages on the customization junctions to form X to X, Y to Y, and X to Y linkage between the segment ends forming the programming junctions, as well as combinations of X to X, Y to Y, and X to Y linkage.

* * * * *

UNITED STATES PATENT AND TRADEMARK OFFICE
CERTIFICATE OF CORRECTION

PATENT NO.   :   5,165,166

DATED        :   November 24, 1992

INVENTOR(S)  :   David H. Carey

It is certified that error appears in the above-identified patent and that said Letters Patent is hereby corrected as shown below:

Claim 3, line 38, column 18, after substantially, insert --parallel channels, each channel including a plurality--

Claim 3, line 47, column 18, change "x" to --X--

Claim 3, line 53, column 18, change "segments" to --segment--

Claim 10, line 41, column 19, change "segment" to --segments--

Claim 19, line 49, column 20, after customization, insert --surface between the segment ends forming the programmable--

Claim 19, line 51, column 20, change "programming" to --programmable--

Claim 11, line 52, column 19, before the word step, delete "the" and insert --said--

Claim 14, line 11, column 20, change "11" to --10--

Claim 16, line 18, column 20, change "5" to --15--

UNITED STATES PATENT AND TRADEMARK OFFICE
CERTIFICATE OF CORRECTION

PATENT NO. : 5,165,166

DATED : November 24, 1992

INVENTOR(S) : David H. Carey

It is certified that error appears in the above-identified patent and that said Letters Patent is hereby corrected as shown below:

Claim 17, line 21, column 20, change "10" to --16--

Signed and Sealed this

Second Day of November, 1993

*Attest:*

BRUCE LEHMAN

*Attesting Officer*     *Commissioner of Patents and Trademarks*